United States Patent
Rao

(10) Patent No.: US 11,387,819 B2
(45) Date of Patent: Jul. 12, 2022

(54) FAULT RESILIENT FLIP-FLOP WITH BALANCED TOPOLOGY AND NEGATIVE FEEDBACK

(71) Applicant: QUALCOMM Incorporated, San Diego, CA (US)

(72) Inventor: Hari Rao, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 0 days.

(21) Appl. No.: 17/118,476

(22) Filed: Dec. 10, 2020

(65) Prior Publication Data
US 2022/0190813 A1 Jun. 16, 2022

(51) Int. Cl.
*H03K 3/3562* (2006.01)
*H03K 19/096* (2006.01)
(Continued)

(52) U.S. Cl.
CPC ....... *H03K 3/35625* (2013.01); *H03K 3/0372* (2013.01); *H03K 3/0375* (2013.01);
(Continued)

(58) Field of Classification Search
CPC .............. H03K 3/0372; H03K 3/0375; H03K 3/354104; H03K 3/35625; H03K 19/0033;
(Continued)

(56) References Cited

U.S. PATENT DOCUMENTS 5,568,429 A * 10/1996 D'Souza .............. H03K 3/0375
327/212
5,612,632 A * 3/1997 Mahant-Shetti ..........................
H03K 3/356156
326/46
(Continued)

FOREIGN PATENT DOCUMENTS

WO 0031871 A1 6/2000
WO 2016057973 A1 4/2016

OTHER PUBLICATIONS

Buchner S.P., et al., "Single-Event Transients in Fast Electronic Circuits," IEEE Nuclear and Space Radiation Effects Conference, Section V, 2001, 5 pages.
(Continued)

*Primary Examiner* — Jason Crawford
(74) *Attorney, Agent, or Firm* — Chui-kiu Teresa Wong

(57) ABSTRACT

The disclosure relates to a latch including a first inverter with a first pair of field effect transistors (FETs) configured with a first channel width to length ratio (W/L), and a second inverter with a second pair of FETs configured with a second W/L different than the first W/L. Another latch includes first and second inverters; a first negative feedback circuit including first and second FETs coupled between first and second voltage rails, the input of the first inverter coupled between the first and second FETs, and the first and second FETs including gates coupled to an output of the first inverter; and a second negative feedback circuit including third and fourth
(Continued)

FETs coupled between the first and second voltage rails, the input of the second inverter coupled between the third and fourth FETs, and the third and fourth FETs including gates coupled to an output of the second inverter.

8 Claims, 7 Drawing Sheets

(51) Int. Cl.
    *H03K 19/003* (2006.01)
    *H03K 19/0185* (2006.01)
    *H03K 3/037* (2006.01)
    *H03K 17/62* (2006.01)

(52) U.S. Cl.
    CPC ... *H03K 17/6257* (2013.01); *H03K 19/00338* (2013.01); *H03K 19/01855* (2013.01); *H03K 19/018521* (2013.01); *H03K 19/0966* (2013.01)

(58) Field of Classification Search
    CPC ....... H03K 19/00338; H03K 19/01855; H03K 19/096; H03K 19/0966
    See application file for complete search history.

(56) References Cited

U.S. PATENT DOCUMENTS

| | | | | |
|---|---|---|---|---|
| 6,204,708 B1* | 3/2001 | Alexander | ......... | H03K 3/35625 327/212 |
| 7,868,677 B2* | 1/2011 | Jain | .................... | H03K 19/0013 327/202 |
| 8,115,531 B1 | 2/2012 | Brown et al. | | |
| 9,590,598 B2 | 3/2017 | Sharma et al. | | |
| 9,825,636 B1 | 11/2017 | Dodrill et al. | | |
| 9,859,876 B1 | 1/2018 | Agarwal et al. | | |
| 10,411,677 B2* | 9/2019 | Kim | .................. | H03K 3/35625 |
| 2009/0002044 A1* | 1/2009 | Kobayashi | .......... | H03K 3/35625 327/202 |
| 2015/0200668 A1* | 7/2015 | Uesugi | ............... | H03K 19/0013 327/109 |
| 2016/0112036 A1* | 4/2016 | Goyal | ................ | H03K 3/35625 327/203 |
| 2016/0126936 A1* | 5/2016 | Dubey | ............... | H03K 3/35625 327/198 |
| 2017/0063350 A1* | 3/2017 | Cheng | ................ | H03K 3/35625 |
| 2017/0194949 A1* | 7/2017 | Srivastava | .......... | H01L 29/1095 |
| 2017/0373697 A1* | 12/2017 | Schober | .................... | H03L 7/24 |
| 2019/0363699 A1* | 11/2019 | Li | .................... | H03K 19/00338 |
| 2020/0212912 A1* | 7/2020 | Huang | ................. | H03K 19/094 |

OTHER PUBLICATIONS

MATUSH B.I., etal., "Area-Efficient Temporally Hardened by Design Flip-Flop Circuits," IEEE Transactions on Nuclear Science, Dec. 2010, vol. 57, No. 6, pp. 3588-3595.
Partial International Search Report—PCT/US2021/061873—ISA/ EPO—dated Apr. 4, 2022.

* cited by examiner

FAULT RESILIENT FLIP-FLOP WITH BALANCED TOPOLOGY AND NEGATIVE FEEDBACK

FIELD

Aspects of the present disclosure relate generally to data flip-flops, and in particular, to a fault resilient flip-flop with balanced topology and negative feedback.

DESCRIPTION OF RELATED ART

Data flip-flops are used in computing circuits to sequentially deliver data through various sub-circuits and combinational logic. The data retained by the flip-flops during the sequential delivery may be affected by noise, such as terrestrial radiation. For example, terrestrial radiation directed at a node of a flip-flop may cause the flip-flop to unintendedly change state or flip (e.g., from a logic one (1) to a logic zero (0), or vice-versa). If such flip-flops are employed in safety-related systems, such as automotive or avionics systems, the consequence of an unintended change in the state of one or more flip-flops may severely compromise the safety of humans relying on such systems.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes a first latch including: a first inverter including a first field effect transistor (FET) coupled between a first voltage rail and a first node, and a second FET coupled between the first node and a second voltage rail, wherein each of the first and second FETs is configured with a first effective channel width to length ratio (W/L); and a second inverter including a third FET coupled between the first voltage rail and a second node; and a fourth FET coupled between the second node and the second voltage rail, wherein the first and second FETs include gates coupled to the second node, wherein the third and fourth FETs include gates coupled to the first node, and wherein each of the third and fourth FETs is configured with a second effective W/L different than the first effective W/L.

Another aspect of the disclosure relates to an apparatus. The apparatus includes a first latch, including: a first clocked inverter including an output coupled to a first node, and an input coupled to a second node, wherein the first clocked inverter is configured to provide first and second transistor turn-on resistances between the first node and first and second voltage rails, respectively; and a first non-clocked inverter including an input coupled to the first node, and an output coupled to the second node, wherein the first non-clocked inverter is configured to provide third and fourth transistor turn-on resistances between the second node and the first and second voltage rails, respectively, wherein the first, second, third, and fourth transistor turn-on resistances are substantially the same.

Another aspect of the disclosure relates to an apparatus. The apparatus includes a first inverter including an output coupled to a first node, and an input coupled to a second node; a first negative feedback circuit including: a first field effect transistor (FET) coupled between a first voltage rail and the second node, wherein first FET includes a gate coupled to the first node; and a second FET coupled between the second node and a second voltage rail, wherein the second FET includes a gate coupled to the first node; a second inverter including an output coupled to the second node, and an input coupled to the first node; and a second negative feedback circuit including: a third FET coupled between the first voltage rail and the first node, wherein the third FET includes a gate coupled to the second node; and a fourth FET coupled between the first node and the second voltage rail, wherein the fourth FET includes a gate coupled to the second node.

Another aspect of the disclosure relates to an apparatus. The apparatus includes a first latch including: a first clocked inverter including an output coupled to a first node, and an input coupled to a second node; a first non-clocked inverter including an input coupled to the first node, and an output coupled to the second node; a first negative feedback circuit configured to couple the second node to a first or second voltage rail based on a first voltage at the first node; and a second negative feedback circuit configured to couple the first node to the first or second voltage rail based on a second voltage at the second node.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

Figure 1A:
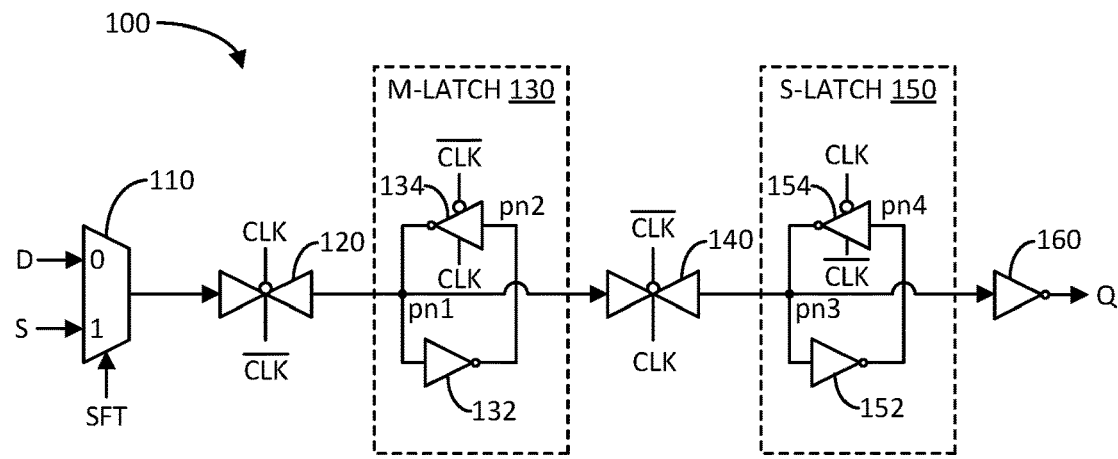
FIG. 1A illustrates a schematic diagram of an example flip-flop.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Computing systems involving safety of humans are often designed to be more fault tolerant than commercial computing systems that typically do not impact human safety. Such fault-tolerant computing systems are often designed to be more resilient to terrestrial radiation or noise that can change logic states at one or more critical nodes in these systems. The unwanted change in the logic state at one or more critical nodes may result in inappropriate operations of the computing system, which may cause severe injury or death to humans. As discussed further herein, the unwanted change in the logic states at the one or more critical nodes may be the result of bit flips in one or more flip-flops in such systems.

Examples of fault-tolerant computing systems are Advanced Driver Assistance Systems (ADAS). These systems provide different levels of autonomous driving of automotive vehicles. For example, an ADAS level "0" system is defined as hands on/driver on, where there is no active assistance system, but provides forward collision warning (FCW), lane departure warning (LDW), and blind spot detection (BSD) warning. An ADAS level "1" system is also defined as hands on/driver on, but further provides adaptive cruise control (ACC) and lane keep assist (LKA). An ADAS level "2" system is defined as hands temporarily off/eyes temporarily off, which provides ACC with lane keeping and traffic jam assist. An ADAS level "3" system is defined as hands off/eyes off, which provides highway autopilot and traffic jam pilot. An ADAS level "4" system is defined as hands off/mind off, which provides full highway autopilot and full urban autopilot. And, an ADAS level "5" system is defined as hands off/driver off, which provides for robo-taxi/shuttles and autonomous delivery fleets.

The higher the ADAS level, the higher requirements in terms of failure in time (FIT) is generally specified. For example, the Automotive Safety Integrity Level (ASIL) has an International Organization for Standardization (ISO) 26262 that specifies FIT requirements for different applications. One (1) FIT is defined as one (1) failure in $10^9$ (one (1) billion) hours in 20 years. For instance, the ASIL A requirement, which is applicable to commercial (non-safety) applications, specifies that the FIT is to be less than or equal to 1000. The ASIL B requirement, which is applicable to automotive safety applications, specifies that the FIT is to be less than or equal to 100. ASIL C and D have more stringent FIT and other requirements.

As mentioned above, terrestrial radiation and/or other types of noise may produce bit flips in sequential circuits, such as flip-flops, which may have an adverse impact in the FIT requirement for systems employing such circuits. Accordingly, it is desirable to improve the design of sequential circuits so that they meet the FIT and other requirements required by the system employing these sequential circuits.

As described herein, one or more latches in a flip-flop are configured to provide substantially the same transistor turn-on resistance between outputs of cross-coupled inverters and upper and lower voltage rails, respectively. This is done so that the outputs have substantially the same tolerance to terrestrial radiation and/or other types of noise. Further, one or more latches in a flip-flop are also configured to include negative feedback circuits to provide additional branches to couple the outputs of the cross-coupled inverters to the upper and lower voltage rails to resist the voltages at the outputs from changing due to terrestrial radiation and/or other types of noise. Additionally, the negative feedback circuits are gated when writing data into the latch to prevent the negative feedback circuits from resisting the writing of the data into the latch.

FIG. 1A illustrates a schematic diagram of an example flip-flop 100 in accordance with an aspect of the disclosure. The flip-flop 100 is configured to receive a data signal (D) or a scan signal (S), and generate an output data signal Q based on the data signal (D) or the scan signal (S) in response to a clock (CLK). The flip-flop 100 may be used in sequential circuits to route the data signal (D) or scan signal (S) from one circuit to another circuit in response to the clock (CLK). The data signal (D) may be actual data generated by an application, such as an automotive application. The scan signal (S) may be a test pattern for testing the operation of the flip-flop 100 and/or other sequential and logic devices coupled to the flip-flop 100.

More specifically, the flip-flop 100 may include a multiplexer 110, a master clocked gate 120, a master latch (M-Latch) 130, a slave clocked gate 140, a slave latch (S-Latch) 150, and an output driver 160 (e.g., inverter). In this example, the multiplexer 110 is a 2-to-1 multiplexer, with two inputs to receive a data signal (D) and a scan signal (S), respectively. The data signal (D) may be data from an application, such as an automotive application. The scan signal (S) may be a test pattern for testing the operation of the flip-flop 100, such as in the case of a design for testability (DFT) implementation. The multiplexer 110 includes a select input to receive a shift (SFT) signal, and an output coupled to an input of the master clocked gate 120. In operation, if the shift signal is a logic low or zero (0), the multiplexer 110 outputs the data signal (D); and if the shift signal is a logic high or one (1), the multiplexer 110 outputs the scan signal (S).

The master clocked gate 120 includes a complementary control input to receive a non-complementary clock CLK and a non-complementary control input to receive a complementary clock $\overline{CLK}$. The master clocked gate 120 includes an output coupled to a first node pn1 of the master latch 130. In operation, if the non-complementary clock CLK and the complementary clock $\overline{CLK}$ are logic low and high, respectively, the master clocked gate 120 passes the data signal (D) or scan signal (S) at its input to its output or node pn1 of the master latch 130; and if the non-complementary clock CLK and the complementary clock $\overline{CLK}$ are logic high and low, respectively, the master clocked gate 120 blocks the data signal (D) or scan signal (S) at its input from passing to its output or node pn1 of the master latch 130.

The master latch 130 includes a non-clocked inverter 132 and a clocked inverter 134, which are cross coupled (e.g., the output of one is coupled to the input of the other, for both inverters). More specifically, the non-clocked inverter 132 includes an input at the first node pn1 of the master latch 130, and an output at a second node pn2 of the master latch 130. The clocked inverter 134 includes an input at the second node pn2, and an output at the first node pn1. The clocked inverter 134 includes a complementary control input to receive the complementary clock $\overline{CLK}$ and a non-complementary control input to receive the non-complementary clock CLK. In operation, if the complementary clock $\overline{CLK}$ and the non-complementary clock CLK are logic low and high, respectively, the clocked inverter 134 is enabled, and the master latch 130 is in opaque mode and latches the data at node pn1. If the complementary clock $\overline{CLK}$ and the non-complementary clock CLK are logic high and low, respectively, the clocked inverter 134 is disabled (e.g., tristated), and the master latch 130 is in transparent mode to receive new data at node pn1.

The slave clocked gate 140 includes an input coupled to node pn1 of the master latch 130, and an output coupled to a first node pn3 of the slave latch 150. The slave clocked gate 140 further includes a complementary control input to receive the complementary clock $\overline{CLK}$ and a non-complementary control input to receive the non-complementary clock CLK. In operation, if the complementary clock $\overline{CLK}$ and the non-complementary clock CLK are logic low and high, respectively, the slave clocked gate 140 passes the data signal (D) or scan signal (S) at its input to its output or node pn3 of the slave latch 150; and if the complementary clock $\overline{CLK}$ and the non-complementary clock CLK are logic high and low, respectively, the slave clocked gate 140 blocks the data signal (D) or scan signal (S) at its input from passing to its output or node pn3 of the slave latch 150.

The slave latch 150 includes a non-clocked inverter 152 and a clocked inverter 154, which are cross coupled. That is, the non-clocked inverter 152 includes an input at the first node pn3 of the slave latch 150, and an output at a second node pn4 of the slave latch 150. The clocked inverter 154 includes an input at the second node pn4, and an output at the first node pn3. The clocked inverter 154 includes a complementary control input to receive the non-complementary clock CLK and a non-complementary control input to receive the complementary clock $\overline{CLK}$. In operation, if the complementary clock $\overline{CLK}$ and the non-complementary clock CLK are logic high and low, respectively, the clocked inverter 154 is enabled, and the slave latch 150 is in opaque mode and latches the data at node pn3. If the complementary clock $\overline{CLK}$ and the non-complementary clock CLK are logic low and high, respectively, the clocked inverter 154 is disabled (e.g., tristated), and the slave latch 150 is in transparent mode to receive new data at node pn3.

The output driver or inverter 160 includes an input coupled to node pn3 of the slave latch 150, and an output to produce an output data signal Q, which could be based on the data signal (D) or the scan signal (S), depending on which one is selected by the multiplexer 110. The output driver or inverter 160 ensures that the polarity of the output data signal Q is the same as the selected input signal (D) or (S). That is, each of the three (odd) devices 110, 120, and 140 invert its input signal to generate its output signal. Thus, the output driver or inverter 160 performs the fourth (even) inversion in the flip-flop 100 to ensure that the polarity of output data signal Q is the same as the selected input signal (D) or (S).

Figure 1B:
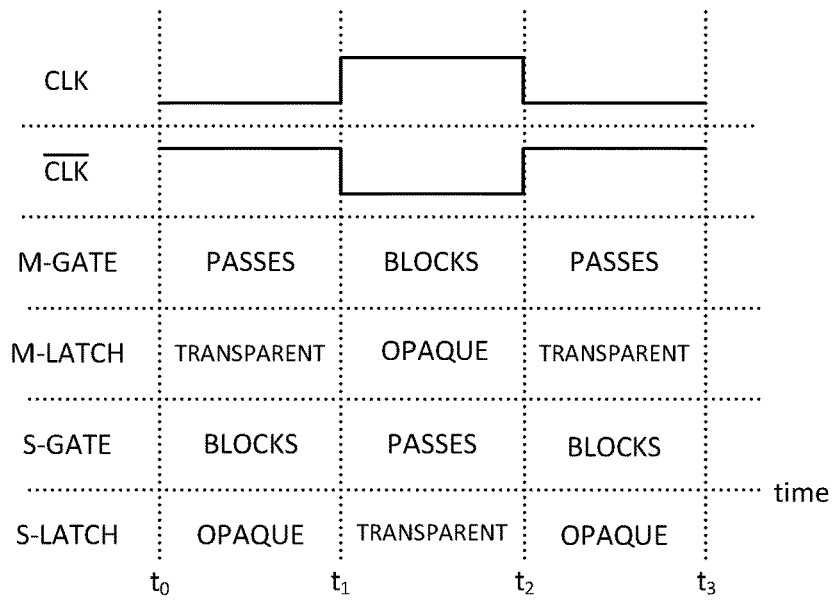
FIG. 1B illustrates a timing diagram of an example operation of the flip-flop of FIG. 1A.

FIG. 1B illustrates a timing diagram of an example operation of the flip-flop 100 in accordance with another aspect of the disclosure. The x- or horizontal-axis of the timing diagram represents time. The y- or vertical axis represents, from top to bottom, the states of the non-complementary clock CLK, the complementary clock $\overline{CLK}$, the master clocked gate (M-GATE) 120, the master latch (M-LATCH) 130, the slave clocked gate (S-GATE) 140, and the slave latch (S-LATCH) 150. In this example, the data signal (D) is selected using the multiplexer 110 via the deasserted shift signal SFT. However, it shall be understood that the flip-flop 100 operates in a similar manner when the scan signal (S) is selected.

The flip-flop 100 may operate as follows: Between times $t_0$ and $t_1$, the non-complementary clock CLK and the complementary clock $\overline{CLK}$ are logic low and high, respectively. Accordingly, the master clocked gate 120 passes the current data signal D(t) from the output of the multiplexer 110 to the first node pn1 of the master latch 130. The master latch 130 is in transparent mode (e.g., the clocked inverter 134 is disabled or tristated), allowing the master latch 130 to receive the current data signal D(t). The slave clocked gate 140 blocks the current data signal D(t) so as to not disturb the slave latch 150 latching of the previous data signal D(t−1). And, the slave latch 150 is in opaque mode (e.g., the clocked inverter 154 is enabled), allowing the slave latch 150 to latch the previous data signal D(t−1). The output driver or inverter 160 inverts the previous data signal D(t−1) to generate the previous output data Q(t−1).

Between times $t_1$ and $t_2$, the non-complementary clock CLK and the complementary clock $\overline{CLK}$ are logic high and low, respectively. Accordingly, the master clocked gate 120 blocks the new data signal D(t+1) so as to not disturb the master latch 130 latching of the current data signal D(t). And, the master latch 130 is in opaque mode (e.g., the clocked inverter 134 is enabled), allowing the master latch 130 to latch the current data signal D(t). The slave clocked gate 140 passes the current data signal D(t) from the master latch 130 to the first node pn3 of the slave latch 150. The slave latch 150 is in transparent mode (e.g., the clocked inverter 154 is disabled or tristated), allowing the slave latch 150 to receive the current data signal D(t).

Between times $t_2$ and $t_3$, the non-complementary clock CLK and complementary clock $\overline{CLK}$ are logic low and high, respectively. Accordingly, the master clocked gate 120 passes the new data signal D(t+1) from the output of the multiplexer 110 to the first node pn1 of the master latch 130. The master latch 130 is in transparent mode (e.g., the clocked inverter 134 is disabled or tristated), allowing the master latch 130 to receive the new data signal D(t+1). The slave clocked gate 140 blocks the new data signal D(t+1) so as to not disturb the slave latch 150 latching of the current data signal D(t). And, the slave latch 150 is in opaque mode (e.g., the clocked inverter 154 is enabled), allowing the slave latch 150 to latch the current data signal D(t). The output driver or inverter 160 inverts the current data signal D(t) to generate the current output data Q(t). The operation of the flip-flop 100 repeats to sequentially clock in and clock out new data.

Figure 2:
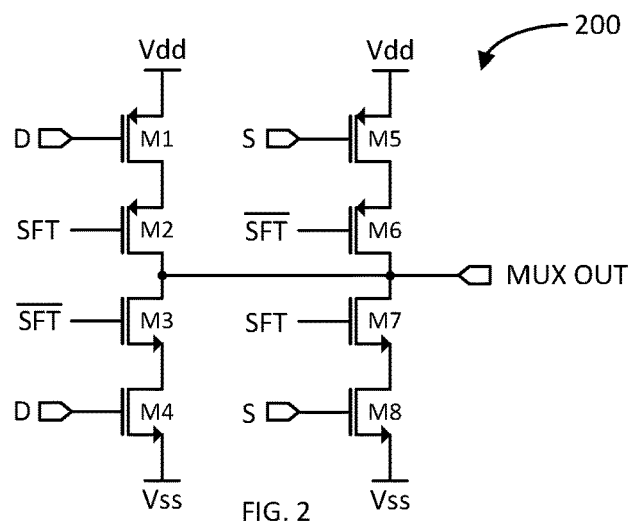
FIG. 2 illustrates a schematic diagram of an example multiplexer.

FIG. 2 illustrates a schematic diagram of an example multiplexer 200 in accordance with another aspect of the disclosure. The multiplexer 200 is an example implementation of the multiplexer 110 previously discussed. The multiplexer 200 may serve as the input data source for the flip-flops discussed further herein.

More specifically, the multiplexer 200 includes a first p-channel metal oxide semiconductor field effect transistor (PMOS FET) M1 and a second PMOS FET M2 coupled in series in that order between an upper voltage rail Vdd and an output (MUX OUT) of the multiplexer 200. That is, the PMOS FET M1 includes a source coupled to the upper voltage rail Vdd, and a drain coupled to a source of the PMOS FET M2. The PMOS FET M2 includes a drain coupled to the output of the multiplexer 200. The multiplexer 200 further includes a first n-channel metal oxide semiconductor field effect transistor (NMOS FET) M3 and a second NMOS FET M4 coupled in series in that order between the output of the multiplexer 200 and a lower voltage rail Vss (e.g., ground). That is, the NMOS FET M3 includes a drain coupled to the output of the multiplexer 200, and a source coupled to a drain of NMOS FET M4. The NMOS FET M4 includes a source coupled to the lower voltage rail Vss. The first PMOS FET M1 and the second NMOS FET M4 include gates to receive the data signal D. The second PMOS FET M2 and the first NMOS FET M3 include gates to receive non-complementary and complementary shift signals SFT and $\overline{\text{SFT}}$, respectively.

The multiplexer 200 further includes a third PMOS FET M5 and a fourth PMOS FET M6 coupled in series in that order between the upper voltage rail Vdd and the output of the multiplexer 200. That is, the PMOS FET M5 includes a source coupled to the upper voltage rail Vdd, and a drain coupled to a source of PMOS FET M6; and the PMOS FET M6 includes a drain coupled to the output of the multiplexer 200. Additionally, the multiplexer 200 includes a third NMOS FET M7 and a fourth NMOS FET M8 coupled in series between the output of the multiplexer 200 and the lower voltage rail Vss. That is, the NMOS FET M7 includes a drain coupled to the output of the multiplexer 200, and a source coupled to a drain of NMOS FET M8; and the NMOS FET M8 includes a source coupled to the lower voltage rail Vss. The third PMOS FET M5 and the fourth NMOS FET M8 include gates to receive the scan signal S. The fourth PMOS FET M6 and the third NMOS FET M7 include gates to receive the complementary and non-complementary shift signals $\overline{\text{SFT}}$ and SFT, respectively.

In operation, if the shift signal is not asserted (SFT and $\overline{\text{SFT}}$ being logic low and high, respectively), the PMOS FET M2 and NMOS FET M3 are turned on, and the PMOS FET M6 and the NMOS FET M7 are turned off. Accordingly, the turned-on PMOS FET M2 and NMOS FET M3 pass the data signal (D) to the multiplexer output, and the turned-off PMOS FET M6 and the NMOS FET M7 block the scan signal (S) from the multiplexer output. Thus, the multiplexer 200 selects the data signal (D) when the shift signal is not asserted.

If the shift signal is asserted (SFT and $\overline{\text{SFT}}$ being logic high and low, respectively), the PMOS FET M2 and NMOS FET M3 are turned off, and the PMOS FET M6 and the NMOS FET M7 are turned on. Accordingly, the turned-on PMOS FET M6 and NMOS FET M7 pass the scan signal (S) to the multiplexer output, and the turned-off PMOS FET M2 and the NMOS FET M3 block the data signal (D) from the multiplexer output. Thus, the multiplexer 200 selects the scan signal (S) when the shift signal is asserted.

Figure 3:
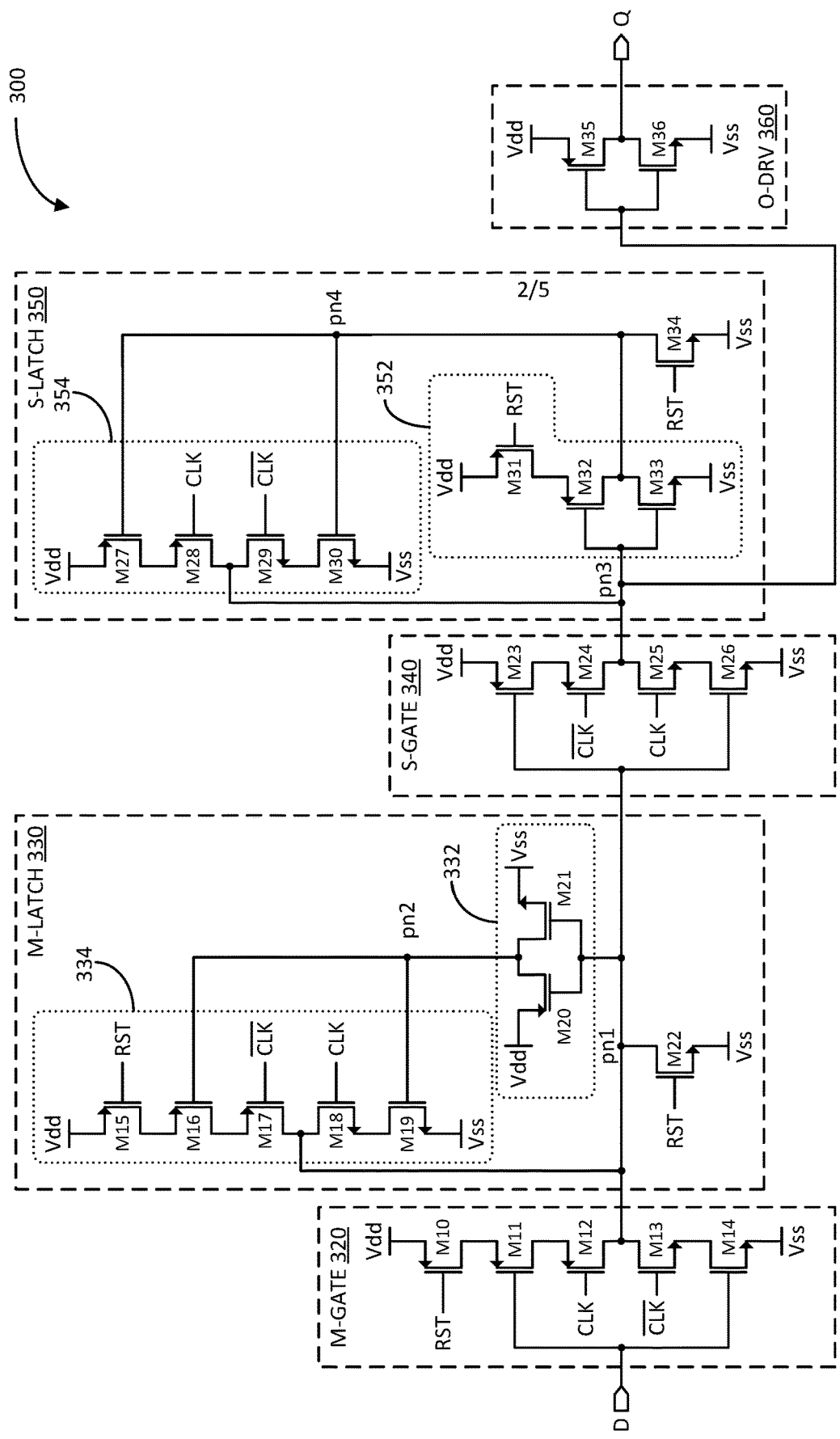
FIG. 3 illustrates a schematic diagram of another example flip-flop.

FIG. 3 illustrates a schematic diagram of another example flip-flop 300 in accordance with another aspect of the disclosure. The flip-flop 300 may be configured for commercial applications, but not for critical safety applications, such as automotive control. Accordingly, the flip-flop 300 may be more susceptible to noise induced by terrestrial radiation and/or other noise sources compared to other flip-flops that are designed to be more resistant to radiation/noise or more fault tolerant. The noise may cause unintended change in the state of the flip-flop 300, which in automotive or other safety applications, may lead to severe impact on safety.

The flip-flop 300 includes a master clocked gate 320 (M-Gate), a master latch 330 (M-Latch), a slave clocked gate 340 (S-Gate), a slave latch 350 (S-Latch), and an output driver 360. Although not shown, a multiplexer (e.g., such as multiplexer 200) to select a data signal (D) or a scan signal (S) as an input for the flip-flop 300 in response to a shift signal, may be coupled to an input of the master clocked gate 320, as in flip-flop 100.

The master clocked gate 320 receives the input data signal (D) and selectively passes the data signal (D) to the master latch 330 in response to a clock (CLK) and a reset signal (RST). The master clocked gate 320 includes PMOS FETs M10-M12 coupled in series in that order between an upper voltage rail Vdd and an output of the master clocked gate 320. That is, the PMOS FET M10 includes a source coupled to the upper voltage rail Vdd, and a drain coupled to a source of PMOS FET M11; the PMOS FET M11 includes a drain coupled to a source of PMOS FET M12; and the PMOS FET M12 includes a drain coupled to the output of the master clocked gate 320. The master clocked gate 320 further includes NMOS FETs M13-M14 coupled in series in that order between the output and a lower voltage rail Vss (e.g., ground). That is, the NMOS FET M13 includes a drain coupled to the output of the master clocked gate 320, and a source coupled to a drain of NMOS FET M14; and the NMOS FET M14 includes a source coupled to the lower voltage rail Vss. The PMOS FET M11 and NMOS FET M14 include gates to receive the data signal (D), the PMOS FET M10 includes a gate to receive the reset signal RST, and the PMOS FET M12 and NMOS FET M13 include gates to receive the non-complementary clock CLK and the complementary clock $\overline{\text{CLK}}$, respectively.

When the reset signal RST is not asserted (RST is at a logic low (e.g., at Vss)), the master clocked gate 320 is enabled. When enabled, if the non-complementary clock CLK and complementary clock $\overline{\text{CLK}}$ are logic low and high, the PMOS FET M12 and NMOS FET M13 are turned on, respectively. Thus, the master clocked gate 320 passes the data signal (D) to the master latch 330. If the non-complementary clock CLK and complementary clock $\overline{\text{CLK}}$ are logic high and low, the PMOS FET M12 and NMOS FET M13 are turned off, respectively. Thus, the master clocked gate 320 blocks the data signal (D) from passing to the master latch 330. When the reset signal RST is asserted (RST is at a logic high (e.g., at Vdd)), the master clocked gate 320 is disabled.

The master latch 330 selectively latches the data signal (D) received from the master clocked gate 320 in response to the clock CLK and the reset signal RST. The master latch 330 includes cross-coupled non-clocked inverter 332 and clocked inverter 334. The non-clocked inverter 332 includes PMOS FET M20 and NMOS FET M21 coupled in series in that order between the upper voltage rail Vdd and the lower voltage rail Vss. The PMOS FET M20 and NMOS FET M21 include gates coupled together at a first node pn1 of the master latch 330. The PMOS FET M20 and NMOS FET M21 include drains coupled together at a second node pn2 of the master latch 330. The PMOS FET M20 includes a source coupled to the upper voltage rail Vdd, and the NMOS FET M21 includes a source coupled to the lower voltage rail Vss.

The clocked inverter 334 includes PMOS FETs M15-M17 coupled in series in that order between the upper voltage rail Vdd and node pn1. That is, the PMOS FET M15 includes a source coupled to the upper voltage rail Vdd, and a drain coupled to a source of PMOS FET M16; the PMOS FET M16 includes a drain coupled to a source of PMOS FET M17; and the PMOS FET M17 includes a drain coupled to node pn1. The clocked inverter 334 further includes NMOS FETs M18-M19 coupled in series in that order between node pn1 and the lower voltage rail Vss. That is, the NMOS FET M18 includes a drain coupled to node pn1, and a source coupled to a drain of NMOS FET M19; and the NMOS FET M19 includes a source coupled to the lower voltage rail Vss. The PMOS FET M15 includes a gate to receive the reset signal RST, the PMOS FET M16 and NMOS FET M19 include gates coupled to node pn2, and the PMOS FET M17 and NMOS FET M18 include gates to receive the complementary clock $\overline{CLK}$ and the non-complementary clock CLK, respectively.

The master latch 330 also includes an NMOS FET M22 coupled between node pn1 and the lower voltage rail Vss, with a gate to receive the reset signal RST. That is, the NMOS FET M22 includes a drain coupled to node pn1 and a source coupled to the lower voltage rail Vss.

When the reset signal RST is not asserted (RST is at logic low (e.g., Vss)), the PMOS FET M15 and NMOS FET M22 are turned on and off, respectively; thereby, enabling the master latch 330. When enabled, if the complementary clock $\overline{CLK}$ and the non-complementary clock CLK are low and high, the PMOS FET M17 and NMOS FET M18 are turned on, respectively. Thus, the master latch 330 latches the data signal (D) at node pn1, and is said to be in opaque mode. If the complementary clock $\overline{CLK}$ and the non-complementary clock CLK are high and low, the PMOS FET M17 and NMOS FET M18 are turned off, respectively. Thus, the clocked inverter 334 is disabled (e.g., tristated); and consequently, the master latch 330 is in transparent mode, able to receive new data (D). When the reset signal RST is asserted (RST is at a logic high (e.g., at Vdd)), the PMOS FET M15 and NMOS FET M22 are turned off and on, respectively; thereby, disabling the master latch 330.

The slave clocked gate 340 receives the data signal (D) from the master latch 330 and selectively passes the data signal (D) to the slave latch 350 in response to the clock CLK. The slave clocked gate 340 includes PMOS FETs M23-M24 coupled in series in that order between the upper voltage rail Vdd and an output of the slave clocked gate 340. That is, the PMOS FET M23 includes a source coupled to the upper voltage rail Vdd, and a drain coupled to a source of PMOS FET M24; and the PMOS FET M24 includes a drain coupled to the output of the slave clocked gate 340. The slave clocked gate 340 further includes NMOS FETs M25-M26 coupled in series in that order between the output of the slave clocked gate 340 and the lower voltage rail Vss. That is, the NMOS FET M25 includes a drain coupled to the output of the slave clocked gate 340, and a source coupled to a drain of NMOS FET M26; and the NMOS FET M26 includes a source coupled to the lower voltage rail Vss. The PMOS FET M23 and NMOS FET M26 include gates to receive the data signal (D) from the master latch 330, and the PMOS FET M24 and NMOS FET M25 include gates to receive the complementary clock $\overline{CLK}$ and the non-complementary clock CLK, respectively.

If the complementary clock $\overline{CLK}$ and the clock CLK are low and high, the PMOS FET M24 and NMOS FET M33 are turned on, respectively. Thus, the slave clocked gate 340 passes the data signal (D) to the slave latch 350. If the complementary clock $\overline{CLK}$ and the non-complementary clock CLK are high and low, the PMOS FET M24 and NMOS FET M25 are turned off, respectively. Thus, the slave clocked gate 340 blocks the data signal (D) from passing to the slave latch 350.

The slave latch 350 selectively latches the data signal (D) received from the slave clocked gate 340 in response to the clock CLK and the reset signal RST. The slave latch 350 includes cross-coupled non-clocked inverter 352 and clocked inverter 354. The non-clocked inverter 352 includes PMOS FETs M31-M32 coupled in series in that order between the upper voltage rail Vdd and a node pn4 of the slave latch 350. That is, the PMOS FET M31 includes a source coupled to the upper voltage rail Vdd, and a drain coupled to a source of PMOS FET M32; and the PMOS FET M32 includes a drain coupled to node pn4. The non-clocked inverter 352 further includes an NMOS FET M33 coupled between the node pn4 and the lower voltage rail Vss. That is, the NMOS FET M33 includes a drain coupled to node pn4 and a source coupled to the lower voltage rail Vss. The PMOS FET M31 includes a gate to receive the reset signal RST. The PMOS FET M32 and NMOS FET M33 include gates coupled together at another node pn3 of the slave latch 350. The output of the slave clocked gate 340 is coupled to node pn3 of the slave latch 350.

The clocked inverter 354 includes PMOS FETs M27-M28 coupled in series in that order between the upper voltage rail Vdd and node pn3. That is, the PMOS FET M27 includes a source coupled to the upper voltage rail Vdd, and a drain coupled to a source of PMOS FET M28; and the PMOS FET M28 includes a drain coupled to node pn3. The clocked inverter 354 further includes NMOS FETs M29-M30 coupled in series in that order between node pn3 and the lower voltage rail Vss. That is, the NMOS FET M29 includes a drain coupled to node pn3, and a source coupled to a drain of NMOS FET M30; and the NMOS FET M30 includes a source coupled to the lower voltage rail Vss. The PMOS FET M27 and NMOS FET M30 include gates coupled to node pn4, and the PMOS FET M28 and NMOS FET M29 include gates to receive the non-complementary clock CLK and the complementary clock $\overline{CLK}$, respectively. The slave latch 350 also includes an NMOS FET M34 coupled between node pn4 and the lower voltage rail Vss, including a gate to receive the reset signal RST. That is, the NMOS FET M34 includes a drain coupled to node pn4 and a source coupled to the lower voltage rail Vss.

When the reset signal RST is not asserted (RST is logic low (e.g., Vss)), the PMOS FET M31 and NMOS FET M34 are turned on and off, respectively; thereby, enabling the slave latch 350. When enabled, if the non-complementary clock CLK and complementary clock $\overline{CLK}$ are low and high, the PMOS FET M28 and NMOS FET M29 are turned on, respectively. Thus, the slave latch 350 latches the data signal (D) at node pn3, and is said to be in opaque mode. If the non-complementary clock CLK and complementary clock $\overline{CLK}$ are high and low, the PMOS FET M28 and NMOS FET M29 are turned off, respectively. Thus, the slave latch 350 is in transparent mode, and able to receive new data (D). When the reset signal RST is asserted (RST is at a logic high (e.g., at Vdd)), the PMOS FET M31 and NMOS FET M34 are turned off and on, respectively; thereby, disabling the slave latch 350.

The output driver 360 receives the data signal (D) from the slave latch 350, and inverts the data signal (D) to generate an output data signal Q. The output driver 360 is configured as an inverter including PMOS FET M35 coupled in series with NMOS FET M36 between the upper voltage rail Vdd and the lower voltage rail Vss. That is, the PMOS FET M35 includes a source coupled to the upper voltage rail Vdd, and the NMOS FET M36 includes a source coupled to the lower voltage rail Vss. The PMOS FET M35 and NMOS FET M36 include gates coupled together and to node pn3 of the slave latch 350, and drains coupled together, which serve as the output Q of the flip-flop 300.

The FETs of the flip-flop 300 are configured to have substantially the same size or effective W/L (e.g., smallest based on current process technology nodes) for increased integrated circuit (IC) density purpose, where W is the effective width of the channel and L is the effective length of the channel. For planar FETs, the effective channel width is related to the width of the gate electrode over the channel, and the effective channel length is related to the distance between the source and drain via the channel. For FIN FETs, the effective channel width is related to the width of each FIN, the height of each FIN, and the number of FINs in a FET, and the effective channel length is related to the distance between the source and drain via the channel. The turn-on resistance $R_{ON}$ of a FET is inversely related to the effective W/L. Accordingly, in this configuration, the turn-on resistance $R_{ON}$ between the nodes pn1, pn2, pn3, and pn4 and the voltage rails Vdd and Vss differ for each node.

For example, the turn-on resistance $R_{ON}$ between node pn2 and the upper voltage rail Vdd or the lower voltage rail Vss is that of a single FET (e.g., PMOS FET M20 or NMOS FET M21), which is referred to herein as "R". The turn-on resistance $R_{ON}$ between node pn1 and the upper voltage rail Vdd is that of three (3) stacked FETs or 3R (e.g., PMOS FETs M15-M17), and between node pn1 and the lower voltage rail Vss is that of two (2) stacked FETs or 2R (e.g., NMOS FETs M18-M19). The turn-on resistance $R_{ON}$ between node pn3 and the upper voltage rail Vdd or the lower voltage rail Vss is that of two (2) stacked FETs or 2R (e.g., PMOS FETs M27-M28 or NMOS FETs M29-M30). And, the turn-on resistance $R_{ON}$ between node pn4 and the upper voltage rail Vdd is that of two (2) stacked FETs or 2R (e.g., PMOS FETs M31-M32), and between node pn4 and the lower voltage rail Vss is one (1) FET or R (e.g., NMOS FET M33).

Thus, because of the imbalance in the turn-on resistances $R_{ON}$ between the nodes pn1-pn4 and the upper voltage rail Vdd and lower voltage rail Vss, the nodes pn1-pn4 have different tolerances to terrestrial radiation or noise. For example, the higher the turn-on resistance, the less tolerant the node is to radiation or noise. The radiation or noise produces a charge or current, which when it flows through the corresponding turn-on resistance from Vdd or to Vss, it generates a voltage change $\Delta V$ related to the current multiplied by the turn-on resistance ($\Delta V=I*R_{ON}$). The change in voltage $\Delta V$ due to radiation or noise may cause the corresponding latch to flip state if it crosses the threshold voltages of the corresponding FETs, which, as discussed, in critical applications, such as automotive safety, may have severe consequences to safety.

The flip-flop 300 is only as good as its weakest link. As node pn1 has the highest turn-on resistance $R_{ON}$ to the upper voltage rail Vdd (e.g., 3R) and to the lower voltage rail Vss (e.g., 2R), it is the node most susceptible to produce a bit flip due to radiation and/or noise; with nodes pn3, pn4, and pn2 being less susceptible in that order.

Thus, a first aspect of the disclosure is to reconfigure a master latch and a slave latch of a flip-flop so that its nodes have substantially the same tolerance to radiation or noise; that is, the turn-on resistance $R_{ON}$ between the nodes and the upper and lower voltage rails Vdd and Vss are substantially the same, respectively. A second aspect of the disclosure is to reconfigure a master latch and a slave latch of a flip-flop to provide negative feedback in order to fight against radiation or noise that may produce a bit flip. A third aspect of the disclosure is that the negative feedback is gated. That is, when data is to be written into the corresponding master or slave latch (e.g., when the latch is in transparent mode), the negative feedback is disabled to prevent the negative feedback from resisting the writing of the data into the latch. When the master or slave latch are latched (e.g., when the latch is in opaque mode), the negative feedback is enabled to make the latches more immune to radiation or noise.

Figure 4:
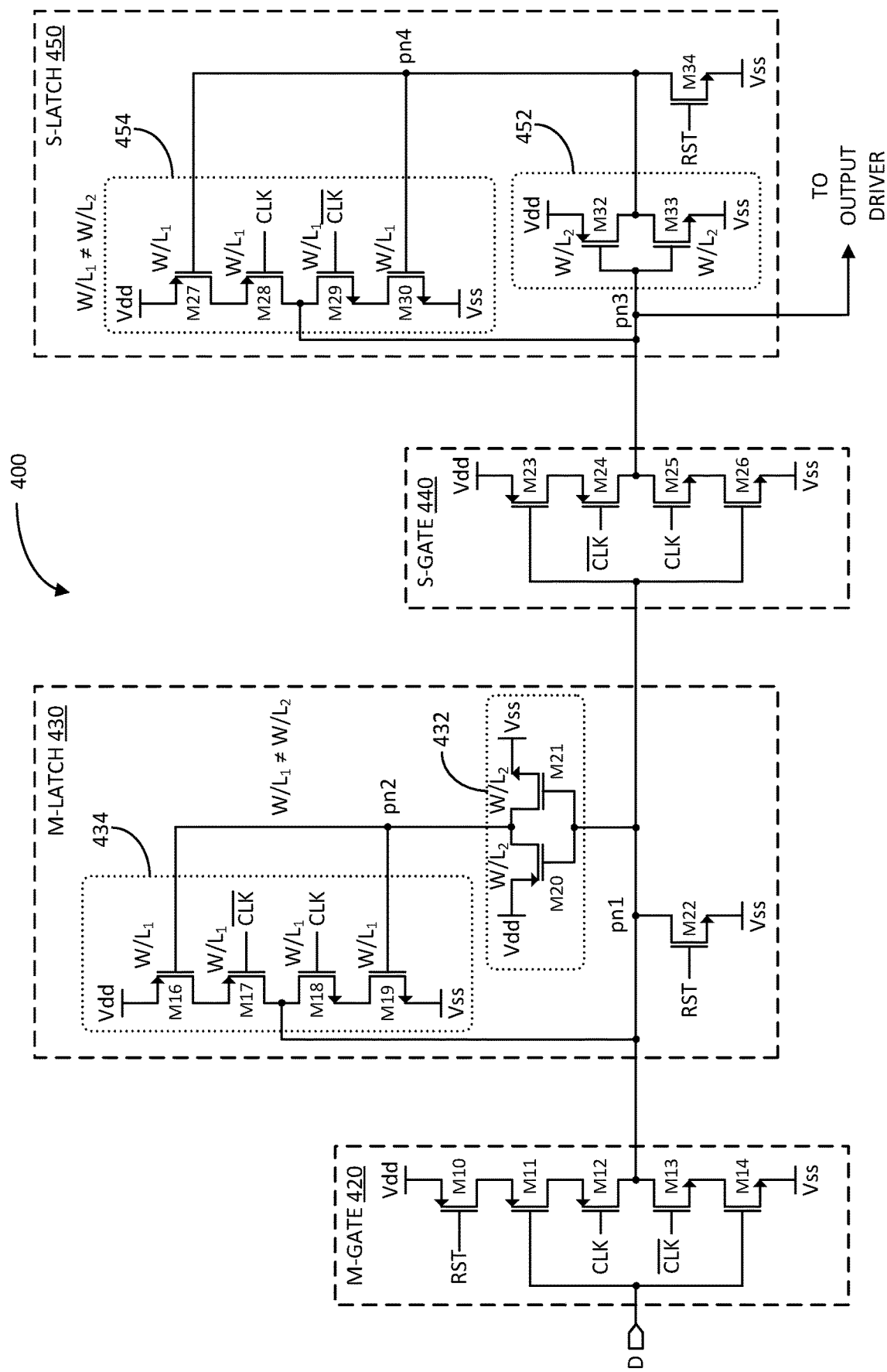
FIG. 4 illustrates a schematic diagram of another example flip-flop in accordance with another aspect of the disclosure.

FIG. 4 illustrates a schematic diagram of an example flip-flop 400 in accordance with another aspect of the disclosure. The flip-flop 400 includes a master latch 430 and a slave latch 450 that are reconfigured to balance the turn-on resistance $R_{ON}$ between the nodes pn1-pn4 and the upper voltage rail Vdd and lower voltage rail Vss, respectively; so that they have substantially the same tolerance to radiation or noise. The other components of the flip-flop 400, namely the master clocked gate 420, the slave clocked gate 440, and the output driver (not shown)) of flip-flop 400 are essentially the same as the master clocked gate 320, the slave clocked gate 340, and the output driver 360 of flip-flop 300, respectively. It shall be understood that a multiplexer (e.g., such as multiplexer 200) to select a data signal (D) or a scan signal (S) as an input for the flip-flop 400 in response to a shift signal, may be coupled to an input of the master clocked gate 420, as in flip-flop 100.

With regard to the master latch 430, the reset PMOS FET M15 of master latch 330 has been removed from a clocked inverter 434 of master latch 430. Accordingly, the source of the PMOS FET M16 is coupled to the upper voltage rail Vdd. Additionally, the size or effective $W/L_1$ of each of PMOS FETs M16-M17 and NMOS FETs M18-M19 in the clocked inverter 434 is substantially different than (e.g., about two times, where substantially or about takes into account processing tolerances) the size or effective $W/L_2$ of each of PMOS FET M20 and NMOS FET M21 in a non-clocked inverter 432 of master latch 430. Accordingly, in the current example, the turn-on resistance $R_{ON}$ of each of the PMOS FETs M16-M17 and NMOS FETs M18-M19 is 0.5R, and the turn-on resistance $R_{ON}$ of each of PMOS FET M20 and NMOS FET M21 is R. Thus, the turn-on resistance $R_{ON}$ of the branch including FETs M16-M17 between node pn1 and the upper voltage rail Vdd and the branch including FETs M18-M19 between the node pn1 and the lower voltage rail Vss is 2*0.5R or R, respectively; and the turn-on resistance $R_{ON}$ of the branch including FET M20 between node pn2 and upper voltage rail Vdd and the branch including FET M21 between node pn2 and the lower voltage rail Vss is also R, respectively. Thus, the turn-on resistances $R_{ON}$ between nodes pn1 and pn2 and the voltage rails are balanced; thereby, the nodes pn1 and pn2 have substantially the same tolerance to radiation or noise.

Similarly, with regard to slave latch 450, the reset PMOS FET M31 of the slave latch 350 has been removed in a non-clocked inverter 452 of slave latch 450. Accordingly, the source of the PMOS FET M32 is coupled to the upper voltage rail Vdd. Additionally, the size or effective $W/L_1$ of each of PMOS FETs M27-M28 and NMOS FETs M29-M30 of the clocked inverter 454 is substantially two times to the size or effective $W/L_2$ of each of PMOS FET M32 and NMOS FET M33 of a non-clocked inverter 452 of slave latch 450. Accordingly, the turn-on resistance $R_{ON}$ of each of the PMOS FETs M27-M28 and NMOS FETs M29-M30 is 0.5R, and the turn-on resistance $R_{ON}$ of each of PMOS FET M32 and NMOS FET M33 is R. Thus, the turn-on resistance $R_{ON}$ of the branch including FETs M27-M28 between node pn3 and the upper voltage rail Vdd and the branch including FETs M29-M30 between node pn3 and the lower voltage rail Vss is 2*0.5R or R, respectively; and the turn-on resistance $R_{ON}$ of the branch including FET M32 between node pn4 and the upper voltage rail Vdd and the branch including FET M33 between node pn4 and the lower voltage rail Vss is also R, respectively. Thus, the turn-on resistances $R_{ON}$ between nodes pn3 and pn4 and the voltage rails are balanced; thereby, the nodes pn3 and pn4 have substantially the same tolerance to radiation or noise.

It shall be understood that the number of transistors and their effective W/Ls in each of the non-clocked inverters 432 and 452 and clocked inverters 434 and 454 can vary in other implementations, while still achieving turn-on resistances $R_{ON}$ between nodes pn1 to pn4 and the voltage rails that are substantially balanced; as flip-flop 400 is merely one example of achieving the balanced turn-on resistances $R_{ON}$.

Figure 5:
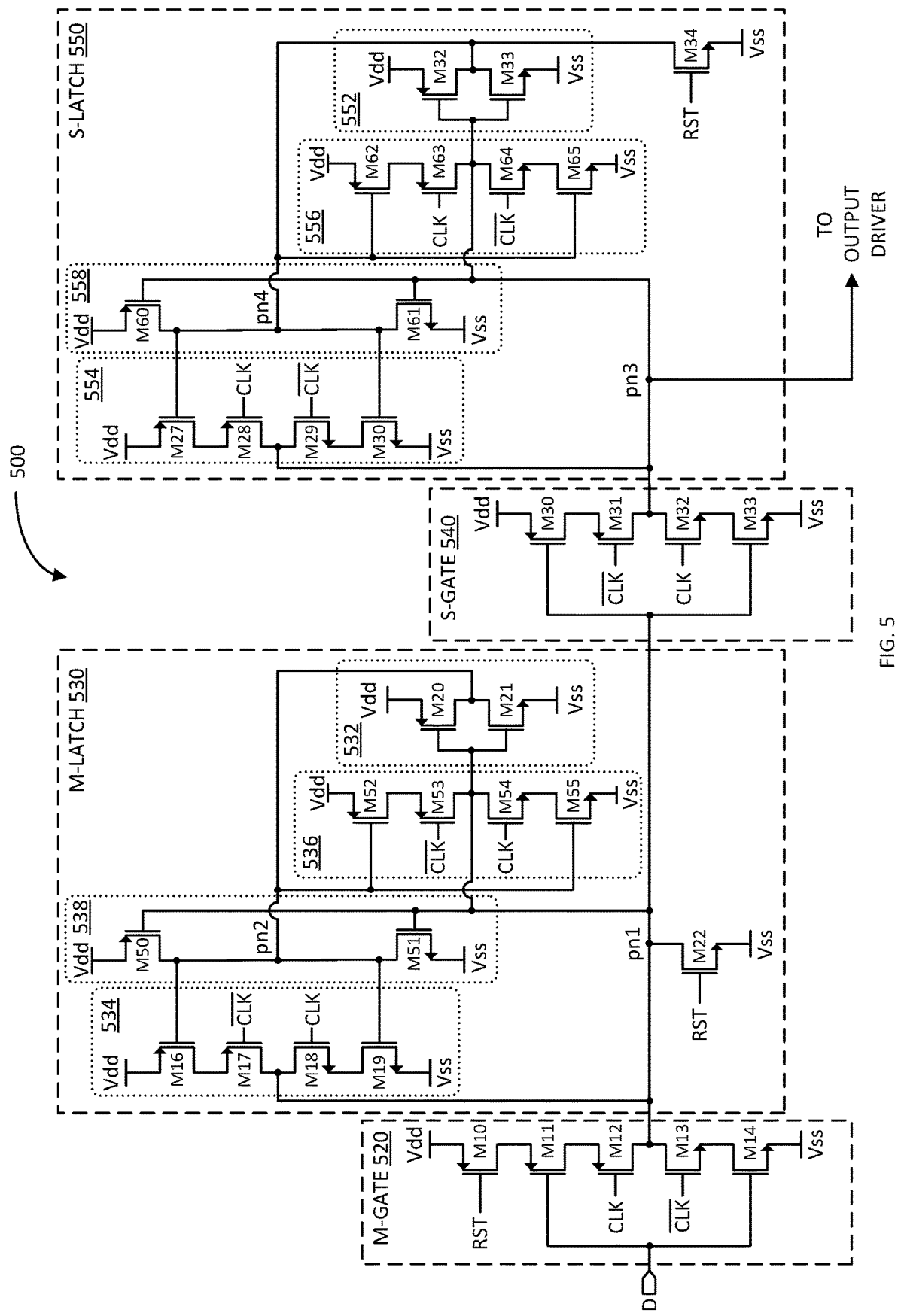
FIG. 5 illustrates a schematic diagram of another example flip-flop in accordance with another aspect of the disclosure.

FIG. 5 illustrates a schematic diagram of another example flip-flop 500 in accordance with another aspect of the disclosure. The flip-flop 500 includes a master latch 530 and a slave latch 550 that is reconfigured to include negative feedback for each of the nodes pn1, pn2, pn3, and pn4 to fight radiation or noise that may cause a latch flip. Similarly, the other components of the flip-flop 500, namely the master clocked gate 520, the slave clocked gate 540, and the output driver (not shown)) of flip-flop 500 are essentially the same as the master clocked gate 320, the slave clocked gate 340, and the output driver 360 of flip-flop 300, respectively.

The master latch 530 includes cross-coupled non-clocked inverter 532 and clocked inverter 534, which may be configured per cross-coupled non-clocked inverter 432 and clocked inverter 434 of flip-flop 400. Similarly, the slave latch 550 includes cross-coupled non-clocked inverter 552 and clocked inverter 554, which may be configured per cross-coupled non-clocked inverter 452 and clocked inverter 454 of flip-flop 400.

Regarding the master negative feedback, the master latch 530 includes a negative feedback circuit 536 for node pn1, including PMOS FETs M52-M53 coupled in series in that order between the upper voltage rail Vdd and node pn1, and NMOS FETs M54-M55 coupled in series in that order between node pn1 and the lower voltage rail Vss. That is, the PMOS FET M52 includes a source coupled to the upper voltage rail Vdd, a drain coupled to a source of the PMOS FET M53; the PMOS FET M53 includes a drain coupled to node pn1; the NMOS FET M54 includes a drain coupled to node pn1, and a source coupled to a drain of NMOS FET M55; and the NMOS FET M55 includes a source coupled to the lower voltage rail Vss. The PMOS FET M52 and NMOS FET M55 include gates coupled to node pn2 for negative feedback purposes, and the PMOS FET M53 and NMOS FET M54 include gates to receive the complementary clock $\overline{CLK}$ and the non-complementary clock CLK for gating the negative feedback, respectively.

The master latch 530 further includes a negative feedback circuit 538 for node pn2, including a PMOS FET M50 coupled between the upper voltage rail Vdd and node pn2, and an NMOS FET M51 coupled between node pn2 and the lower voltage rail Vss. That is, the PMOS FET M50 includes a source coupled to the upper voltage rail Vdd, and a drain coupled to node pn2; and the NMOS FET M51 includes a drain coupled to node pn2 and a source coupled to the lower voltage rail Vss. The PMOS FET M50 and NMOS FET M51 include gates coupled to node pn1 for negative feedback purposes.

Assuming the negative feedback is enabled by the complementary clock $\overline{CLK}$ and non-complementary clock being low and high, respectively, and turning on PMOS FET M53 and NMOS FET M54, the negative feedback operates as follows:

If the logic voltages at node pn1 is logic low and at node pn2 is logic high, and radiation or noise tends to increase the low voltage at node pn1, the high voltage at node pn2 maintains NMOS FET M55 of the negative feedback circuit 536 turned on, which couples the lower voltage rail Vss to node pn1. The coupling of the lower voltage rail Vss to node pn1 by NMOS FET M55 fights or counters the radiation or noise attempting to pull up node pn1. Thus, the non-noisy high logic voltage at node pn2 turning on NMOS FET M55 operates as an anchor to maintain the voltage at node pn1 low even when affected by radiation and noise.

Similarly, if the logic voltages at node pn1 is logic high and at node pn2 is logic low, and radiation or noise tends to decrease the high voltage at node pn1, the low voltage at node pn2 maintains PMOS FET M52 of the negative feedback circuit 536 turned on, which couples the upper voltage rail Vdd to node pn1. The coupling of the upper voltage rail Vdd to node pn1 by PMOS FET M52 fights or counters the radiation or noise attempting to pull down node pn1. Thus, the non-noisy low logic voltage at node pn2 turning on PMOS FET M52 operates as an anchor to maintain the voltage node pn1 high even when affected by radiation and noise.

Likewise, if the logic voltages at node pn1 is logic low and at node pn2 is logic high, and radiation or noise tends to decrease the high voltage at node pn2, the low voltage at node pn1 maintains PMOS FET M50 of the negative feedback circuit 538 turned on, which couples the upper voltage rail Vdd to node pn2. The coupling of the upper voltage rail Vdd to node pn2 by PMOS FET M50 fights or counters the radiation or noise attempting to pull down node pn2. Thus, the non-noisy logic low voltage at node pn1 turning on PMOS FET M50 operates as an anchor to maintain the voltage node pn2 high even when affected by radiation and noise.

Similarly, if the logic voltages at node pn1 is logic high and at node pn2 is logic low, and radiation or noise tends to increase the low voltage at node pn2, the high voltage at node pn1 maintains NMOS FET M51 of the negative feedback circuit 538 turned on, which couples the lower voltage rail Vss to node pn2. The coupling of the lower voltage rail Vss to node pn2 by NMOS FET M51 fights or counters the radiation or noise attempting to pull up node pn2. Thus, the non-noisy high logic voltage at node pn1 turning on NMOS FET M51 operates as an anchor to maintain the voltage at node pn2 low even when affected by radiation and noise.

When the master latch 530 is in transparent mode in response to the complementary clock CLK and non-complementary clock CLK being high and low, respectively, the PMOS FET M53 and NMOS FET M54 of the negative feedback circuit 536 are turned off or gated. With regard to the clocked inverter 534, the gating of the negative feedback operation provided by the negative feedback circuit 538 is already built in by the clock operation with respect to PMOS FET M17 and NMOS FET M18. Thus, the gating of the negative feedback circuits 536 and 538 allows data (D) to be written into the master latch 530 from the master clocked gate 520 without the negative feedback fighting the data writing operation.

Regarding the slave negative feedback, the slave latch 550 includes a negative feedback circuit 556 for node pn3, including PMOS FETs M62-M63 coupled in series in that order between the upper voltage rail Vdd and node pn3, and NMOS FETs M64-M65 coupled in series in that order between node pn3 and the lower voltage rail Vss. The PMOS FET M62 and NMOS FET M65 include gates coupled to node pn4 for negative feedback purposes, and the PMOS FET M63 and NMOS FET M64 include gates to receive the non-complementary clock CLK and the complementary clock $\overline{CLK}$ for gating the negative feedback, respectively.

The slave latch 550 further includes a negative feedback circuit 558 for node pn4, including a PMOS FET M60 coupled between the upper voltage rail and the node pn4, and an NMOS FET M61 coupled between node pn4 and the lower voltage rail Vss. The PMOS FET M60 and NMOS FET M61 include gates coupled to node pn3 for negative feedback purposes.

Assuming the negative feedback is enabled by the non-complementary clock CLK and the complementary clock $\overline{CLK}$ being high and low, respectively, and turning on PMOS FET M63 and NMOS FET M64, the negative feedback operates as follows:

If the logic voltages at node pn3 is logic low and at node pn4 is logic high, and radiation or noise tends to increase the low voltage at node pn3, the high voltage at node pn4 maintains NMOS FET M65 of the negative feedback circuit 556 turned on, which couples the lower voltage rail Vss to node pn3. The coupling of the lower voltage rail Vss to node pn3 by NMOS FET M65 fights or counters the radiation or noise attempting to pull up node pn3. Thus, the non-noisy high logic voltage at node pn4 turning on NMOS FET M65 operates as an anchor to maintain the voltage at node pn3 low even when affected by radiation and noise.

Similarly, if the logic voltages at node pn3 is logic high and at node pn4 is logic low, and radiation or noise tends to decrease the high voltage at node pn3, the low voltage at node pn4 maintains PMOS FET M62 of the negative feedback circuit 556 turned on, which couples the upper voltage rail Vdd to node pn3. The coupling of the upper voltage rail Vdd to node pn3 by PMOS FET M62 fights or counters the radiation or noise attempting to pull down node pn3. Thus, the non-noisy low logic voltage at node pn4 turning on PMOS FET M62 operates as an anchor to maintain the voltage node pn3 high even when affected by radiation and noise.

Likewise, if the logic voltages at node pn3 is logic low and at node pn4 is logic high, and radiation or noise tends to decrease the high voltage at node pn4, the low voltage at node pn3 maintains PMOS FET M60 of the negative feedback circuit 558 turned on, which couples the upper voltage rail Vdd to node pn4. The coupling of the upper voltage rail Vdd to node pn4 by PMOS FET M60 fights or counters the radiation or noise attempting to pull down node pn4. Thus, the non-noisy logic low voltage at node pn3 turning on PMOS FET M60 operates as an anchor to maintain the voltage node pn4 high even when affected by radiation and noise.

Similarly, if the logic voltages at node pn3 is logic high and at node pn4 is logic low, and radiation or noise tends to increase the low voltage at node pn4, the high voltage at node pn3 maintains NMOS FET M61 of the negative feedback circuit 558 turned on, which couples the lower voltage rail Vss to node pn4. The coupling of the lower voltage rail Vss to node pn4 by NMOS FET M61 fights or counters the radiation or noise attempting to pull up node pn4. Thus, the non-noisy high logic voltage at node pn3 turning on NMOS FET M61 operates as an anchor to maintain the voltage at node pn4 low even when affected by radiation and noise.

When the slave latch 550 is in transparent mode in response to the complementary clock CLK and non-complementary clock CLK being high and low, respectively, the PMOS FET M63 and NMOS FET M64 of the negative feedback circuit 556 are turned off or gated. With regard to the clocked inverter 554, the gating of the negative feedback operation provided by the negative feedback circuit 538 is already built in by the clock operation with respect to PMOS FET M28 and NMOS FET M29. Thus, the gating of the negative feedback circuits 556 and 558 allows data (D) to be written into the slave latch 550 from the slave clocked gate 540 without the negative feedback fighting the data writing operation.

The latches 430 and 450 of the flip-flop 400 increased the tolerance to a bit flip as a result of terrestrial radiation and/or noise by reducing the transistor turn-on resistances of nodes pn1, pn3, and pn4 to that of node pn2 (e.g., the turn-on resistance of a single FET). The latches 530 and 550 of the flip-flop 500 includes negative feedback circuits 536/538 and 556/558 to actively fight against terrestrial radiation and/or noise that may change the voltages at nodes pn1/pn2 and pn3/pn4 such that one or more bit-flips may occur, respectively.

Figure 6:
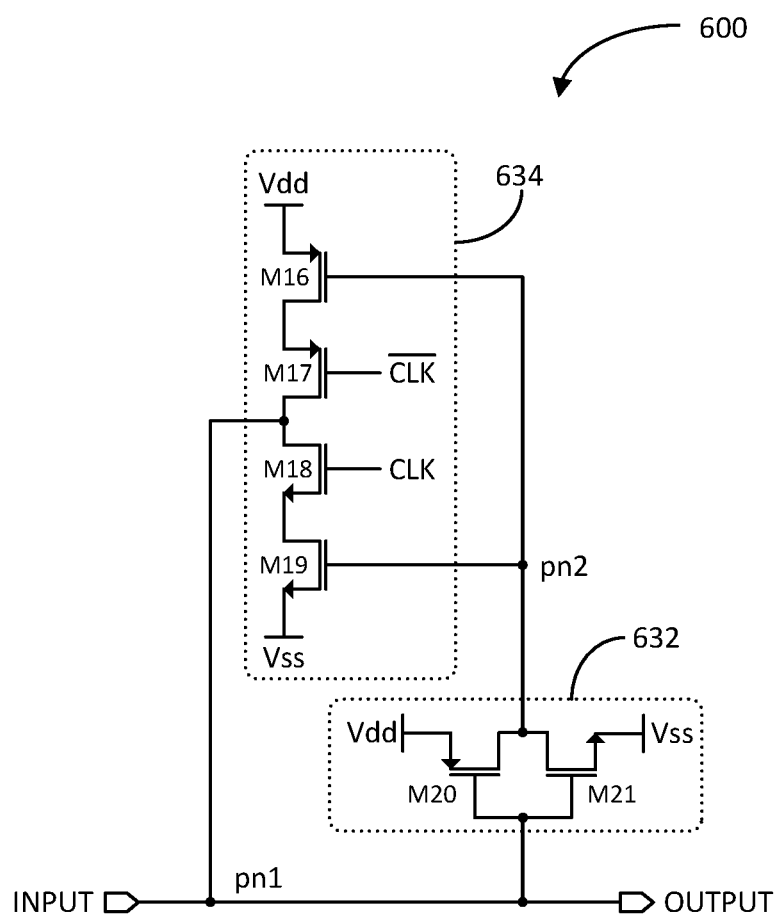
FIG. 6 illustrates a schematic diagram of an example latch in accordance with another aspect of the disclosure.

It shall be understood that the concepts described herein may be independently implemented or combined in a flip-flop. For example, a flip-flop may independently implement the balanced radiation tolerant nodes of flip-flop 400, the negative feedback of flip-flop 500, and the gated negative feedback of flip-flop 500. Alternatively, a flip-flop may combine in any manner the balanced radiation tolerant nodes of flip-flop 400, the negative feedback of flip-flop 500, and the gated negative feedback of flip-flop 500. Although the negative feedback circuits 536, 538, 556 and 558 are illustrated, this is only for illustration without suggesting any limitations as to the scope of the subject matter described here. Other negative feedback mechanisms can be applied to fight or counter the radiation or noise at the nodes FIG. 6 illustrates a schematic diagram of an example latch 600 in accordance with another aspect of the disclosure. The latches 430 and 450 previously discussed in detail were part of the flip-flop 400. However, the latches as described herein need not be part of a flip-flop, and may be used in other circuitry. The latch 600 may be configured similar to latch 430.

The latch 600 includes a non-clocked inverter 632 with FETs M20 and M21 in the same configuration as in non-clocked inverter 432 previously discussed. The latch 600 includes a clocked inverter 634 with FETs M16-M19 in the same configuration as clocked inverter 434 previously discussed. Similarly, the size of each of the FETs M16-M19 may be different than (e.g., substantially two times) the size of each of FETs M20 and M21 such that the transistor turn-on resistances between node pn1 and the voltage rails Vdd and Vss are substantially the same as the transistor turn-on resistances between node pn2 and the voltage rails Vdd and Vss, respectively. The latch 600 need not include the reset FET M22 or M34 as in latches 430 and 450, respectively. As illustrated, node pn1 may serve as the input and/or output of the latch 600.

Figure 7:
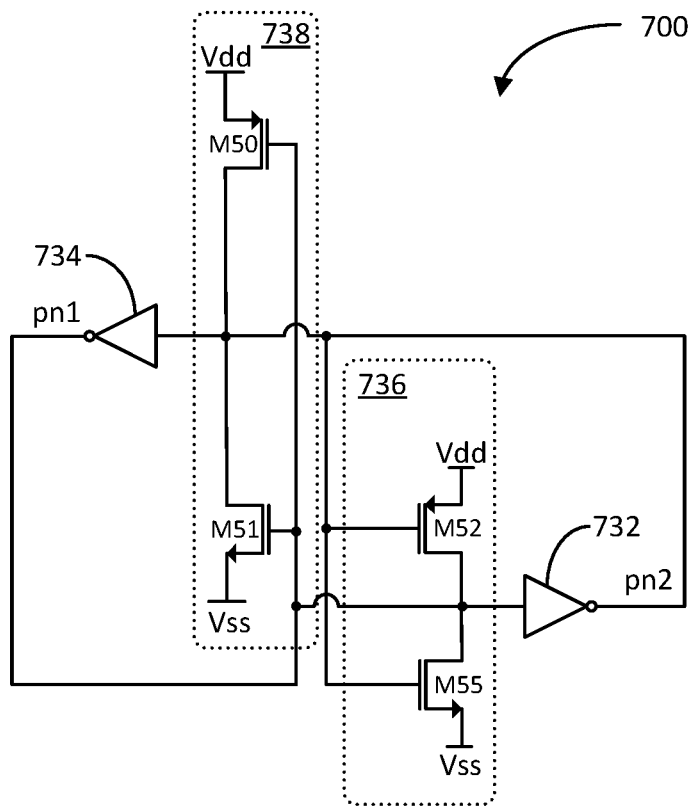
FIG. 7 illustrates a schematic diagram of another example latch in accordance with another aspect of the disclosure.

FIG. 7 illustrates a schematic diagram of another example latch 700 in accordance with another aspect of the disclosure. The latches 530 and 550 previously discussed in detail were part of the flip-flop 500. However, the latches as described herein need not be part of a flip-flop, and may be used in other circuitry. The latch 700 may be configured similar to latch 530.

The latch 700 includes a first inverter 734 including an output coupled to node pn1 and an input coupled to node pn2. The latch 700 further includes a first negative feedback circuit 738 including a FET M50 (e.g., PMOS FET) coupled between an upper voltage rail Vdd and node pn2 (e.g., source coupled to Vdd and drain coupled to pn2), wherein the FET M50 includes a gate coupled to node pn1, and a FET M51 (e.g., NMOS FET) coupled between node pn2 and a lower voltage rail Vss (e.g., drain coupled to pn2 and source coupled to Vss), wherein the FET M51 includes a gate coupled to node pn1.

The latch 700 includes a second inverter 732 including an output coupled to node pn2 and an input coupled to node pn1. The latch 700 further includes a second negative feedback circuit 736 including a FET M52 (e.g., PMOS FET) coupled between the upper voltage rail Vdd and node pn1 (e.g., source coupled to Vdd and drain coupled to pn1), wherein the FET M52 includes a gate coupled to node pn2, and a FET M55 (e.g., NMOS FET) coupled between node pn1 and the lower voltage rail Vss (e.g., drain coupled to pn1 and source coupled to Vss), wherein the FET M55 includes a gate coupled to node pn2. Node pn1 or node pn2 may serve as an input and/or output of the latch 700.

Figure 8:
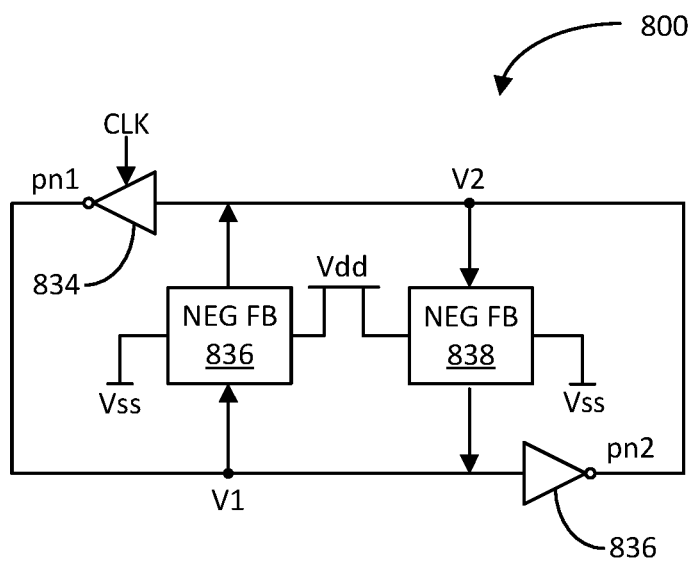
FIG. 8 illustrates a schematic diagram of another example latch in accordance with another aspect of the disclosure.

FIG. 8 illustrates a schematic diagram of another example latch 800 in accordance with another aspect of the disclosure. The latch 800 may be configured similar to latch 530 previously discussed. The latch 800 includes a clocked inverter 834 including an output coupled to node pn1, and an input coupled to node pn2. The latch 800 further includes a non-clocked inverter 836 including an input coupled to node pn1, and an output coupled to node pn2.

Additionally, the latch 800 includes a first negative feedback circuit 836 configured to couple the node pn2 to the upper voltage rail Vdd or lower voltage rail Vss based on a first voltage V1 at node pn1 similar to negative feedback circuit 538. For example, in response to the first voltage V1 being substantially the same as the supply voltage on the upper voltage rail Vdd, the first negative feedback circuit 836 is configured to couple node pn2 to the lower voltage rail Vss. Conversely, in response to the first voltage V1 being substantially the same as the supply voltage on the lower voltage rail Vss, the first negative feedback circuit 836 is configured to couple node pn2 to the upper voltage rail Vdd.

The latch 800 also includes a second negative feedback circuit 838 configured to couple the node pn1 to the upper voltage rail Vdd or lower voltage rail Vss based on a second voltage V2 at node pn2 similar to negative feedback circuit 536. For example, in response to the second voltage V2 being substantially the same as the supply voltage on the upper voltage rail Vdd, the second negative feedback circuit 838 is configured to couple node pn1 to the lower voltage rail Vss. Conversely, in response to the second voltage V2 being substantially the same as the supply voltage on the lower voltage rail Vss, the second negative feedback circuit 838 is configured to couple node pn1 to the upper voltage rail Vdd. Node pn1 or pn2 may serve as an input and/or output of the latch 800.

Figure 9:
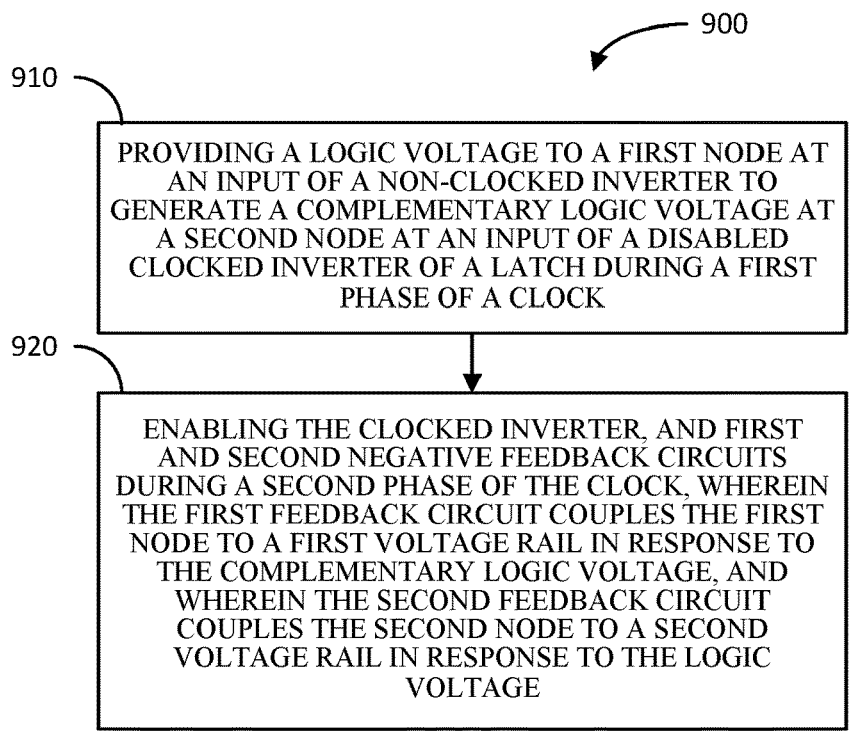
FIG. 9 illustrates a flow diagram of an example method of operating a latch in accordance with another aspect of the disclosure.

FIG. 9 illustrates a flow diagram of an example method 900 of operating a latch in accordance with another aspect of the disclosure. The latch may be part of a flip-flop, such as the master latch and/or slave latch of the flip-flops 400 and 500 previously discussed. The method 900 includes providing a logic voltage to a first node at an input of a non-clocked inverter to generate a complementary logic voltage at a second node at an input of a disabled clocked inverter of a latch during a first phase of a clock (block 910).

The method 900 further includes enabling the clocked inverter, and first and second negative feedback circuits during a second phase of the clock, wherein the first feedback circuit couples the first node to a first voltage rail in response to the complementary logic voltage, and wherein the second feedback circuit couples the second node to a second voltage rail in response to the logic voltage (block 920).

Figure 10:
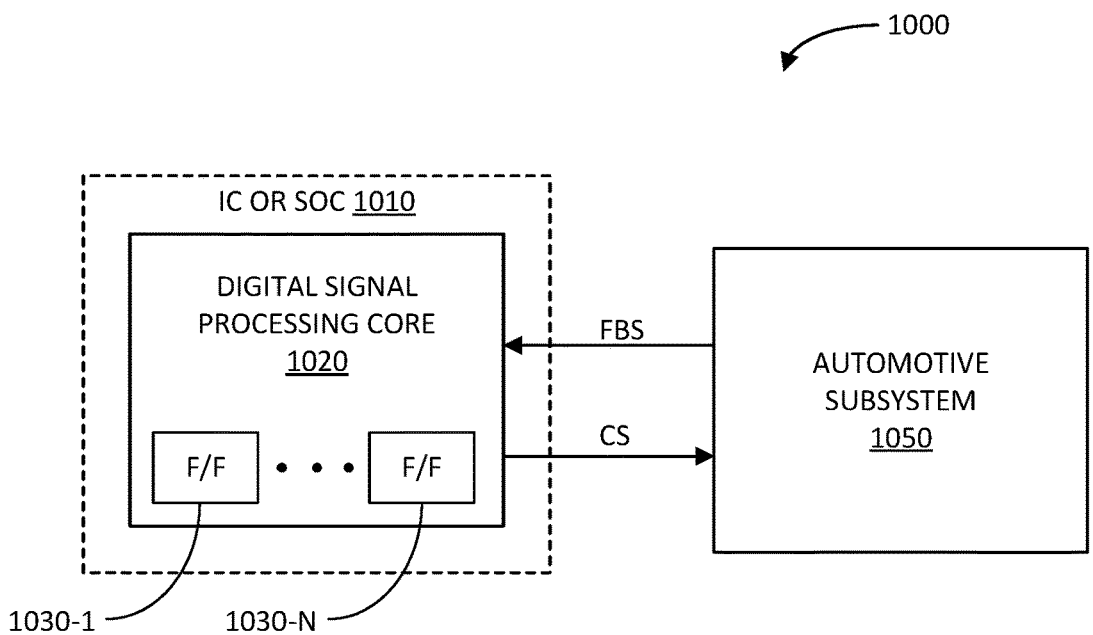
FIG. 10 illustrates a block diagram of an example vehicle safety system in accordance with another aspect of the disclosure.

FIG. 10 illustrates a block diagram of an example vehicle safety system 1000 in accordance with another aspect of the disclosure. In this example, the vehicle safety system 1000 pertains to an automotive system, but it shall be understood that other types of system may employ of the various flip-flops described herein.

The vehicle safety system 1000 includes an integrated circuit (IC) 1010, which may be configured as a system on chip (SOC). The IC 1010 includes a digital signal processing core 1020, which, in turn, includes a set of flip-flops (F/F) 1030-1 to 1030-N. Each of the set of flip-flops 1030-1 to 1030-N may be configured per flip-flop 400 or 500, or any combination thereof as previously discussed.

The vehicle safety system 1000 may further include an automotive subsystem 1050, which, for example, may be a cruise control subsystem, a forward collision warning (FCW) subsystem, lane departure warning (LDW) subsystem, blind spot detection (BSD) warning subsystem, adaptive cruise control (ACC) subsystem, lane keep assist (LKA) subsystem, ACC with lane keeping subsystem, traffic jam assist subsystem, full highway autopilot subsystem, full urban autopilot subsystem, robo-taxi/shuttle subsystem, autonomous delivery fleet subsystem, or other.

Using a first subset of the flip-flops 1030-1 to 1030-N, the digital signal processing core 1020 may generate and provide a control signal (CS) to control an operation of the automotive subsystem 1050. Using a second subset of flip-flops 1030-1 to 1030-N, the digital signal processing core 1020 may receive and process a feedback signal (FBS) from the automotive subsystem 1050. The digital signal processing core 1020 may generate the control signal (CS) and/or perform other functions based on the feedback signal (FBS). Being configured per flip-flop 400 and/or 500, the set of flip-flops 1030-1 to 1030-N are more resilient to terrestrial radiation and/or other types of noise, ensuring that the vehicle safety system 1000 meets the FIT requirements specified by the relevant standard.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
   a first latch comprising:
      a first inverter comprising:
         a first field effect transistor (FET) coupled between a first voltage rail and a first node; and
         a second FET coupled between the first node and a second voltage rail, wherein each of the first and second FETs is configured with a first effective channel width to length ratio (W/L); and
      a second inverter comprising:
         a third FET coupled between the first voltage rail and a second node; and
         a fourth FET coupled between the second node and the second voltage rail, wherein the first and second FETs include gates coupled to the second node, wherein the third and fourth FETs include gates coupled to the first node, and wherein each of the third and fourth FETs is configured with a second effective W/L different than the first effective W/L;
   a first clocked gate including a first input and a first output coupled to the first node of the first latch;
   a second clocked gate including a second input coupled to the first node of the first latch, and a second output; and a second latch comprising:
   a third inverter comprising:
      a fifth FET coupled between the first voltage rail and a third node, wherein the third node is coupled to the second output of the second clocked gate; and
      a sixth FET coupled between the third node and the second voltage rail, wherein each of the fifth and sixth FETs is configured with the first effective W/L; and
   a fourth inverter comprising:
      a seventh FET coupled between the first voltage rail and a fourth node; and
      an eighth FET coupled between the fourth node and the second voltage rail, wherein the fifth and sixth FETs include gates coupled to the fourth node, wherein the seventh and eighth FETs include gates coupled to the third node, and wherein each of the seventh and eighth FETs is configured with the second effective W/L.

2. The apparatus of claim 1, further comprising:
a first clocked gate including an output coupled to the first node; and
a second clocked gate including an input coupled to the first node, and an output coupled to the third node.

3. The apparatus of claim 2, further comprising:
a multiplexer including a first input to receive a first data signal, a second input to receive a second data signal, and an output coupled to an input of the first clocked gate; and
an output driver including an input coupled to the third node, and an output to produce a selected one of the first data signal or the second data signal.

4. The apparatus of claim 1, wherein:
the first inverter comprises a first branch between the first voltage rail and the first node and comprising the first FET, and a second branch between the second voltage rail and the first node comprising the second FET;
the second inverter comprises a third branch between the first voltage rail and the second node and comprising the third FET, and a fourth branch between the second voltage rail and the second node and comprising the fourth FET; and
the first, second, third, and fourth branches have substantially a same turn-on resistance.

5. An apparatus, comprising:
a first latch, comprising:
   a first clocked inverter including an output coupled to a first node, and an input coupled to a second node, wherein the first clocked inverter is configured to provide first and second transistor turn-on resistances between the first node and first and second voltage rails, respectively; and
   a first non-clocked inverter including an input coupled to the first node, and an output coupled to the second node, wherein the first non-clocked inverter is configured to provide third and fourth transistor turn-on resistances between the second node and the first and second voltage rails, respectively, wherein the first, second, third, and fourth transistor turn-on resistances are the same.

6. The apparatus of claim 5, wherein the first latch further comprises:
   a first negative feedback circuit configured to couple the second node to a first or second voltage rail based on a first voltage at the first node; and
   a second negative feedback circuit configured to couple the first node to the first or second voltage rail based on a second voltage at the second node.

7. The apparatus of claim 6, wherein the first clocked inverter and the second negative feedback circuit are enabled by a clock.

8. The apparatus of claim 5, further comprising a second latch, comprising:
   a second clocked inverter including an output coupled to a third node, and an input coupled to a fourth node, wherein the second clocked inverter is configured to provide fifth and sixth transistor turn-on resistances between the third node and the first and second voltage rails, respectively; and
   a second non-clocked inverter including an input coupled to the third node, and an output coupled to the fourth node, wherein the second non-clocked inverter is configured to provide seventh and eighth transistor turn-on resistances between the fourth node and the first and second voltage rails, respectively, wherein the fifth, sixth, seventh, and eighth transistor turn-on resistances are the same.

* * * * *